US008683277B1

(12) United States Patent
Varnica et al.

(10) Patent No.: US 8,683,277 B1
(45) Date of Patent: Mar. 25, 2014

(54) DEFECT DETECTION USING PATTERN MATCHING ON DETECTED DATA

(75) Inventors: Nedeljko Varnica, San Jose, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 282 days.

(21) Appl. No.: 13/180,723

(22) Filed: Jul. 12, 2011

Related U.S. Application Data

(60) Provisional application No. 61/363,916, filed on Jul. 13, 2010.

(51) Int. Cl.
*G11C 29/00* (2006.01)
*G01R 31/28* (2006.01)
*G06F 11/00* (2006.01)

(52) U.S. Cl.
USPC .......................................... 714/718; 714/736

(58) Field of Classification Search
USPC .......... 714/718, 736, 795, 770, 6.12, 719, 25, 714/53, 799; 360/53.17, 69, 49, 53; 455/458; 365/200; 369/53.1
See application file for complete search history.

(56) References Cited

U.S. PATENT DOCUMENTS

| | | | | |
|---|---|---|---|---|
| 5,446,604 A * | 8/1995 | Chiba | ............................. | 360/49 |
| 5,729,552 A * | 3/1998 | Yorimitsu | ..................... | 714/718 |
| 6,731,442 B2 * | 5/2004 | Jin et al. | .......................... | 360/31 |
| 6,747,829 B2 * | 6/2004 | Stanek et al. | ................... | 360/53 |
| 6,976,196 B2 * | 12/2005 | Watanabe | ..................... | 714/718 |
| 7,237,178 B1 * | 6/2007 | Sutardja et al. | ............... | 714/770 |
| 8,161,357 B2 * | 4/2012 | Tan et al. | ...................... | 714/780 |
| 8,176,400 B2 * | 5/2012 | Tan et al. | ...................... | 714/791 |
| 8,305,703 B2 * | 11/2012 | Oberg | ............................. | 360/39 |
| 8,386,827 B2 * | 2/2013 | Xu | ................................... | 713/400 |
| 2010/0088558 A1 * | 4/2010 | Hishinuma et al. | ........... | 714/718 |
| 2012/0021780 A1 * | 1/2012 | Okuda | ........................... | 455/458 |
| 2012/0030539 A1 * | 2/2012 | Graef et al. | ................... | 714/758 |
| 2012/0047396 A1 * | 2/2012 | Garani et al. | ................ | 714/6.12 |
| 2012/0254679 A1 * | 10/2012 | Tan et al. | ...................... | 714/718 |
| 2013/0064060 A1 * | 3/2013 | Oberg | ........................ | 369/53.15 |

* cited by examiner

Primary Examiner — Phung M Chung

(57) ABSTRACT

Systems and methods for detection of defects on a magnetic storage medium. The method comprises: (1) receiving incoming detected data generated by reading information recorded on a storage medium, (2) identifying the defects in the storage medium based on comparison between the incoming detected data and a data pattern wherein the data pattern is predetermined; and (3) storing location information indicative of locations of the defects on the storage medium.

20 Claims, 11 Drawing Sheets

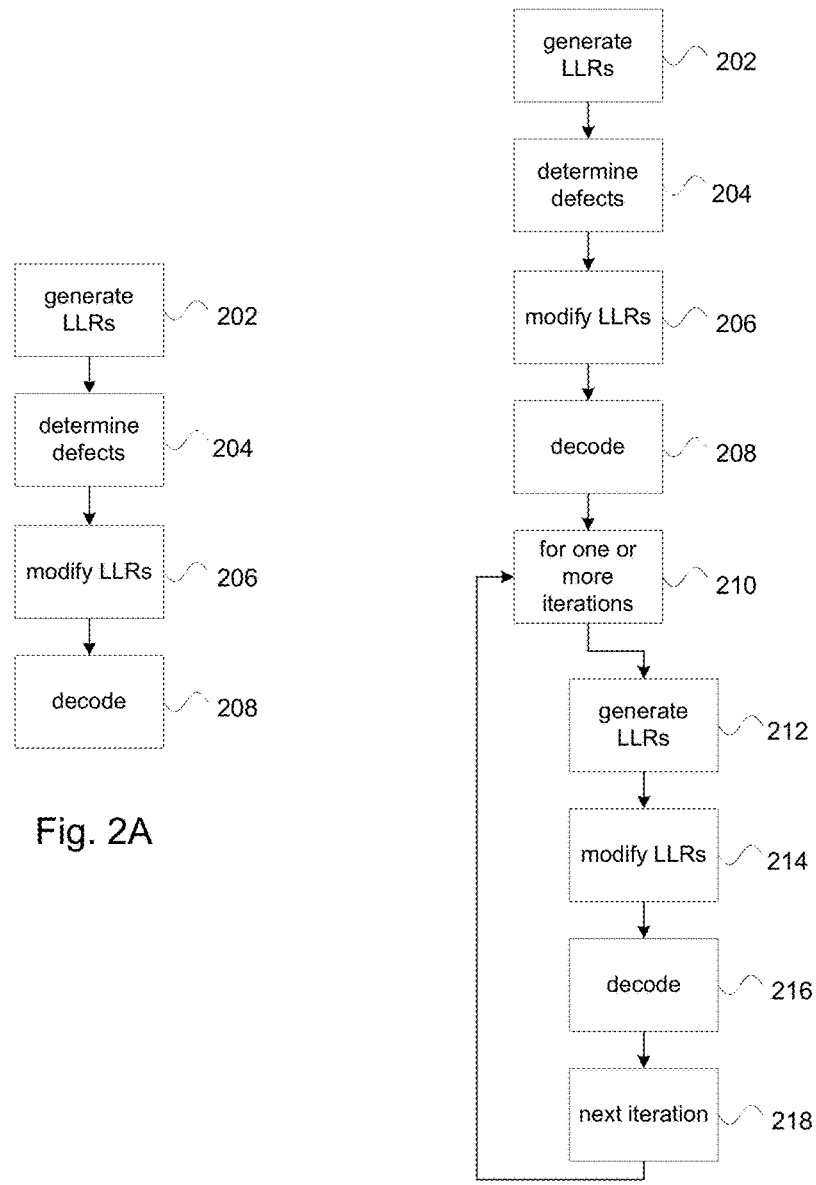

Fig. 5
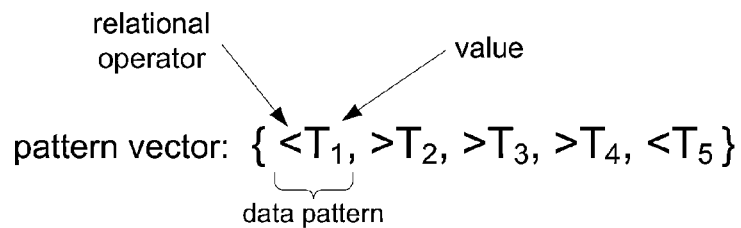
pattern vector 1: { <$T_1$, >$T_2$, <$T_3$, >$T_4$, <$T_5$, >$T_6$, ..., <$T_{w-1}$, >$T_w$}
window size, W = $w$
$T_1 = T_3 = T_5 = T_{w-1} = -X$
$T_2 = T_4, = T_6 = T_w = +X$
pattern vector 2: { >$T_2$, <$T_1$, >$T_4$, <$T_3$, >$T_6$, <$T_5$, ..., >$T_w$, <$T_{w-1}$ }
window size, W = $w$
$T_1 = T_3 = T_5 = T_{w-1} = -X$
$T_2 = T_4, = T_6 = T_w = +X$
pattern vector 3: { >T, >T, >T, >T, >T, >T, >T, >T, >T, >T }
window size, W=10
T = +8
Fig. 5A
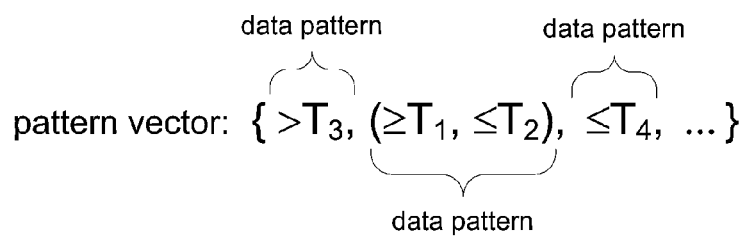
Fig. 5B
pattern vector: { (≥$T_1$, ≤$T_2$), (≤$T_3$, ≥$T_4$), >$T_5$, (≤$T_6$, ≥$T_7$) }
window size, W > 4
Fig. 5C

DEFECT DETECTION USING PATTERN MATCHING ON DETECTED DATA

CROSS REFERENCE TO RELATED APPLICATIONS

The present disclosure claims priority to U.S. Provisional App. No. 61/363,916 filed on Jul. 13, 2010, and is incorporated herein by reference in its entirety for all purposes.

BACKGROUND

The present disclosure relates to data storage media and in particular to the detection of defects on data storage media.

Unless otherwise indicated herein, the approaches described in this section are not prior art to the claims in this application and are not admitted to be prior art by inclusion in this section.

Magnetic recording systems store data on a magnetic medium so that the information can be subsequently retrieved. Defect events are not uncommon in hard disk drive (HDD) systems. To achieve low error rates, data can be written at a low density such that each transition in the patterns of magnetization recorded (written) on the magnetic medium results in a strong voltage from the read head which is localized to that particular transition, allowing for recovery of the information using conventional peak detection. However, there is also a conflicting goal of storing as much information as possible on the magnetic medium, which can be achieved by increasing the density but at the cost of increasing error rates.

Defects typically occur in bursts; i.e., groups of consecutive bits/symbols in a given sector (or block, or codeword). While long bursts (e.g., 50 bits or longer) are generally easier to detect, short bursts are typically much more difficult. One of the most difficult classes of burst errors to detect is the occurrence of several short bursts in a single sector.

The difficulty lies in setting the parameters of a detector so that short burst defects can be detected with a low probability of missing a defect, while at the same time avoiding having too many false alarms. For example, a detector that is configured to provide near-100% accuracy in detecting defect locations on the storage medium is likely to also trigger a very large number of false alarms, namely the flagging of non-defect bits as defects. Such types of burst errors are especially detrimental in iterative decoder systems, which are widely used in disk storage devices.

These and other issues are addressed by embodiments of the present disclosure, individually and collectively.

SUMMARY

Detection of defects in a magnetic storage medium in accordance with embodiments of the present disclosure includes reading data from the magnetic storage medium and generating detected data from the read data. Based on one or more patterns in the detected data, one or more defects in the storage medium may be detected. Locations of the defects may be stored. The detected data may be modified depending on the defects detected.

In other embodiments, an iterative channel detector/decoder configuration may include using the defect locations to modify subsequently generated detected data produced from the output of a detector and/or a decoder.

In other embodiments, the detected data may be produced by a channel detector.

Modifications of the detected data may include replacing the detected data with one or more predefined values. The detected data may be scaled by a scaling factor. The detected data may be truncated.

In other embodiments, the detected data may be compared to one or more data patterns to identify patterns in the detected data. A sliding window technique may be used to compare subsets of the detected data with the one or more data patterns.

In embodiments, the detected data may be log likelihood ratio (LLR) data.

BRIEF DESCRIPTION OF THE DRAWINGS

FIGS. 2A and 2B represent process flows for processing data in accordance with the present disclosure.

FIGS. 5 and 5A-5D illustrate various LLR pattern vectors in accordance with embodiments of the present disclosure.

DETAILED DESCRIPTION

Described herein is a method and apparatus for detection of defects on a storage medium.

In the following description, for purposes of explanation, numerous examples and specific details are set forth in order to provide a thorough understanding of the present disclosure. It will be evident, however, to one skilled in the art that the present disclosure as defined by the claims may include some or all of the features in these examples alone or in combination with other features described below, and may further include modifications and equivalents of the features and concepts described herein.

Figure 1A:
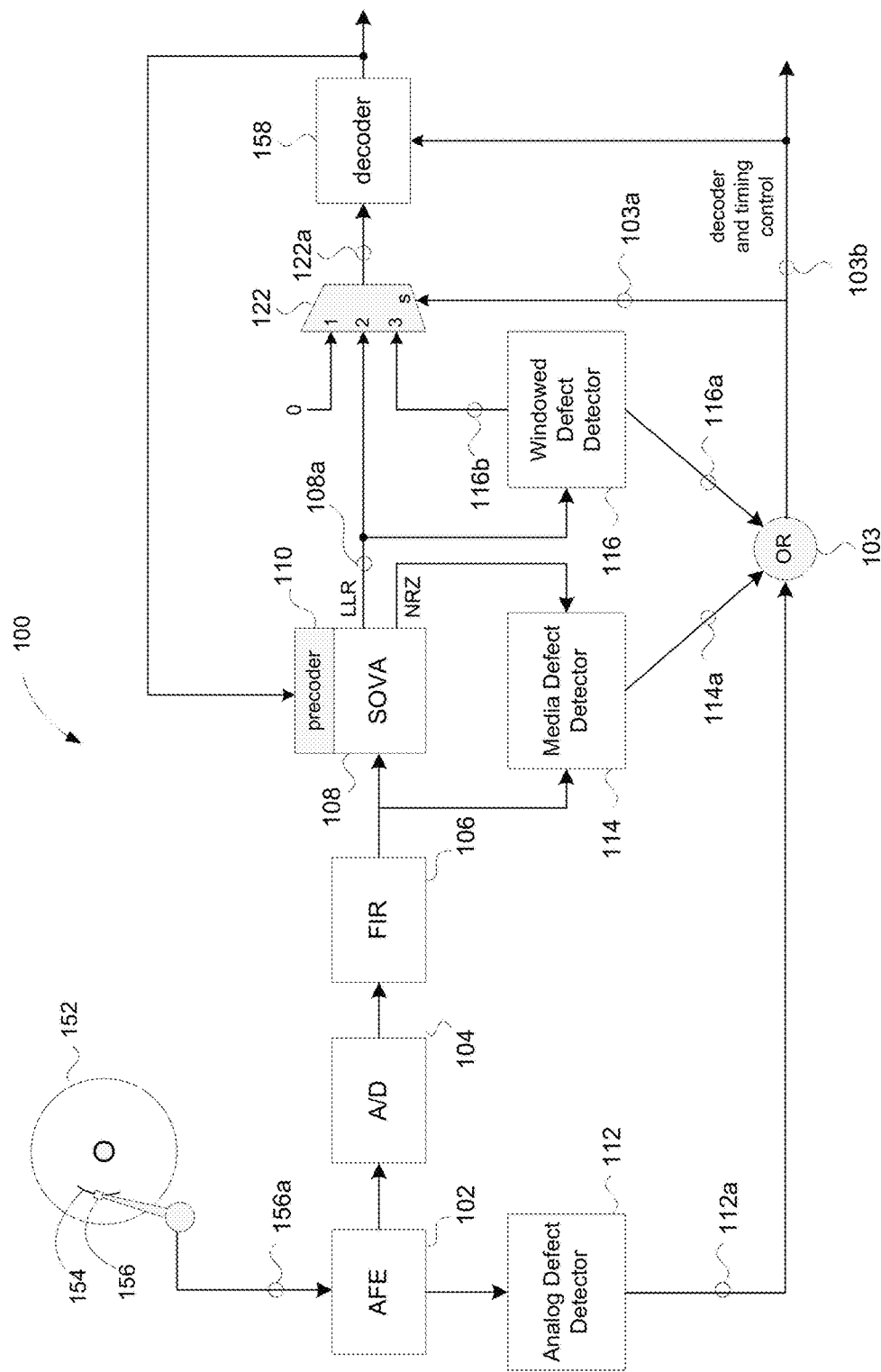
FIG. 1A is a block diagram of a read channel in accordance with an embodiment of the present disclosure.

FIG. 1A shows a read channel 100 for a hard disk drive in accordance with an embodiment of the present disclosure. In a hard disk drive, data is recorded on a storage medium 152, for example a layer of magnetic material disposed on a platter (disk). The data may be recorded on the storage medium 152 as patterns of magnetization. The data recorded on the storage medium can be organized in accordance with any of a number of known conventions; e.g., blocks, tracks, etc. The term "sector" will be used herein as a general term to refer to a unit of data that is read from the storage medium 152. For example, a sector may refer to a 4096-bit block of data. A read/write head 156 senses the patterns of magnetization for a block of data 154 and generates a corresponding analog signal 156*a* that is delivered to the read channel 100. The analog signal 156*a* is representative of the pattern of magnetizations recorded on the storage medium 152.

In some embodiments, the read channel 100 may include an Analog Front End (AFE) 102 (e.g., a preamp) which receives the analog signal 156*a*. An Analog to Digital (A/D) converter 104 converts the analog signal 156*a* into a digital signal comprising a stream of digital data that serves as input data and is further processed downstream. For example, the input data can be fed into a Finite Impulse Response (FIR) filter 106 to condition the digital signal (e.g., to provide bandpass filtering). The input data then proceeds into a suitable channel detector 108. In a particular embodiment, the channel detector 108 is a Soft Output Viterbi Algorithm (SOVA) detector, although it can be appreciated that other known channel detectors can be used. The channel detector 108 produces two streams of data: Log Likelihood Ratio (LLR) data 108$a$, and Non-Return to Zero (NRZ) data (although the detector can be adapted for line coding schemes other than NRZ). More generally, embodiments in accordance with the present disclosure are applicable to any form of detected data, and are not restricted to LLR detection data. For example, embodiments may be used with hard decision detection data. However, for the purposes of the following discussion, processing using LLR detection data will be described, keeping in mind that processing can be performed on forms of detected data.

The channel detector 108 may include a precoder component 110. As known in the art, a precoder 110 can be used to potentially improve system performance in systems in which the noise is correlated. For example, errors in the channel (e.g., hard disk drive systems that have high user bit densities) tend to be consecutive. Error events, such as +−, +−+, −+−, +−+−, −+−+, +−+−+, and so on, tend to be more prevalent than singleton errors (e.g., a −error, or a +error). Singletons are dominant in memory-less Additive White Gaussian Noise (AWGN) channels, for example. The "+" notation refers to an error from −1 to +1, and the "−" notation refers to an error from +1 to −1. Because of the consecutive nature of such error events, a precoder can be used to map long error events into shorter ones, providing a lower Bit Error Rate (BER) input to the decoder. An example of a precoder 110 is known as a 1/(1+D) precoder, which maps +−+−+−+ error events into 2 bit errors; e.g., a +00000−, where "0" denotes no error.

In some embodiments, detection of defects on the storage medium 152 can be provided in the processing path of the read channel 100. An analog defect detector 112 can be provided to receive an output of the AFE 102 to detect defects that may manifest in the received analog signal. The analog defect detector 112 may produce one or more control flags and/or data 112$a$ for downstream processing by a decoder 158. A media defect detector 114 can be provided to receive the output (FIR data) of the FIR filter 106 and the NRZ data from the channel detector 108. The media defect detector 114 may detect defects based on the FIR data and the NRZ data, and produce one or more control flags and/or data 114$a$ for downstream processing. The analog defect detector 112 and the media defect detector 114 employ circuits and detection schemes that are commonly known to those of ordinary skill in the relevant data storage arts. In some embodiments, an iterative architecture can be employed where an output of the decoder 158 is fed back to the channel detector 108.

In accordance with the present disclosure, a windowed defect detector 116 can receive the LLR data 108$a$ produced by channel detector 108. Using the LLR data 108$a$, defects in the storage medium 152 can be detected. Suitable control flags and/or data 116$a$ can be produced for downstream processing. The defect detector 116 can produce output LLR data 116$b$ based on the incoming LLR data 108$a$. These aspects of the windowed defect detector 116 will be discussed in more detail below.

In some embodiments, a combiner 103 can receive the control flags and/or data 112$a$, 114$a$, and 116$a$ from respective defect detectors 112, 114, and 116. The combiner 103 can output control and/or data signals 103$b$ selected from among the control flags and/or data 112$a$, 114$a$, 116$a$ and feed the control and/or data signals to a downstream decoder and timing control circuit for further processing. The combiner 103 can output a select signal 103$a$ which feeds into a MUX 122. The control flags and/or data 116$a$ may include a MUX select signal.

The MUX 122 produces replacement LLR data 122$a$ that can feed into the downstream decoder 158. In some embodiments, the replacement LLR data 122$a$ may be selected from among three inputs of MUX 122. A first input is data "0". A second input is the LLR data 108$a$ produced by the channel detector 108. A third input is the output LLR data 116$b$ produced by the defect detector 116. A selector input control "s" receives the select signal 103$a$ from the combiner 103.

Figure 1B:
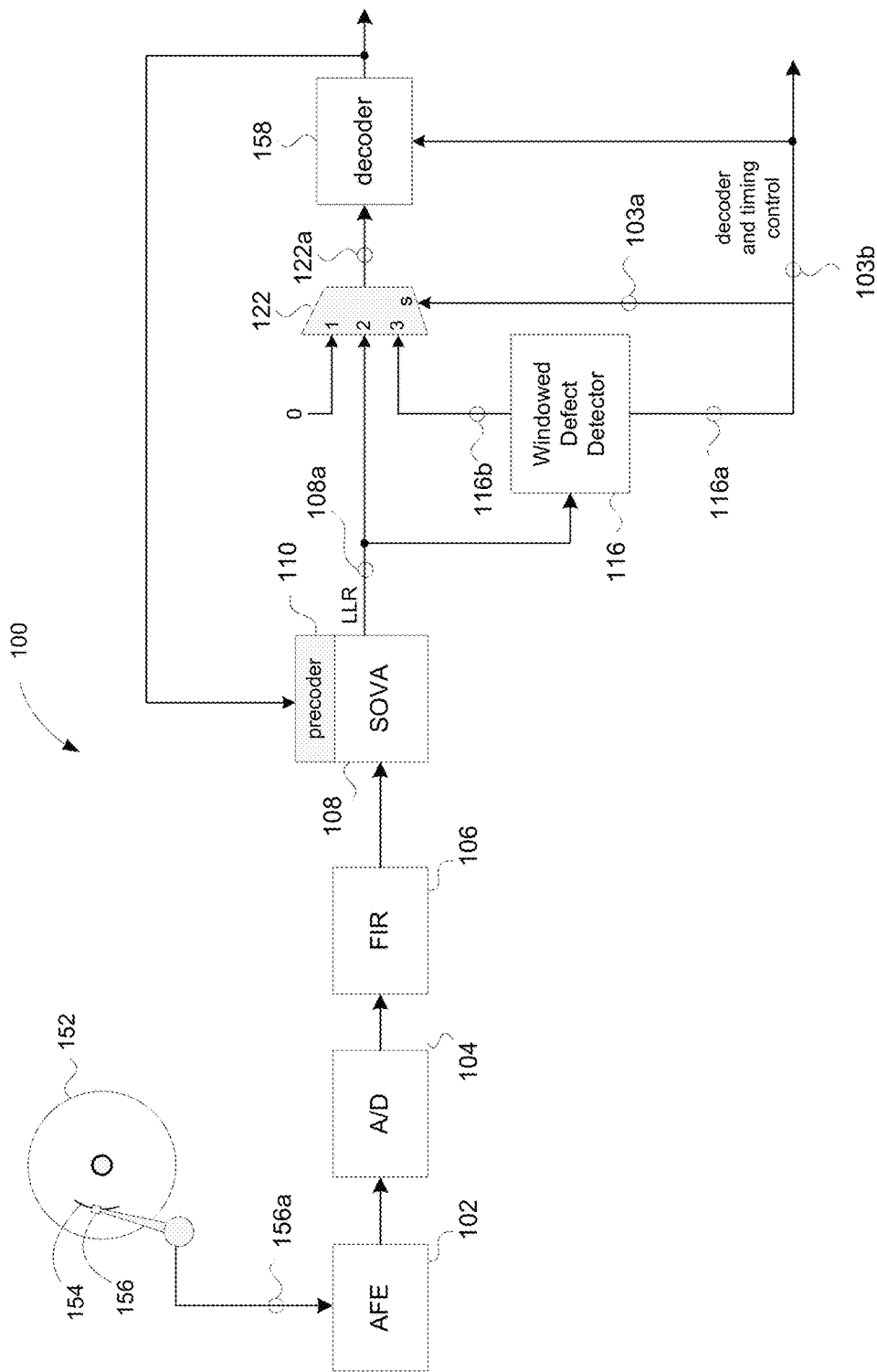
FIG. 1B is a block diagram of another embodiment of a read channel.

In some embodiments, either the analog defect detector 112 or the media defect detector 114 may be omitted. In some embodiments, both the analog defect detector 112 and the media defect detector 114 may be omitted; see for example, FIG. 1B.

In some embodiments, processing of error events may proceed as illustrated in FIG. 2A. For example, data may be read from the storage medium 152 in blocks of data such as codewords, sectors and so on, and processed through circuits 102-106. The output of the filter 106 may be blocks of data that feeds into the channel detector 108. At 202, the channel detector 108 may produce a series of LLR data in response to receiving blocks of data from the filter 106. At 204, defects can be determined from the LLR data in accordance with the present disclosure using the defect detector 116, discussed in further detail below.

In other embodiments, the LLR data that feeds into the decoder 158 can be replaced, mapped, or otherwise modified via the MUX 122 (block 206). For example, a typical modification is to replace the LLR by zero ("0"). Thus, the MUX 122 can be operated by the defect detector 116 to select the first input (hardcoded value "0") for certain defects detected in the LLR data by the defect detector, thus masking the error by effectively erasing it.

The MUX 122 can be operated by the defect detector 116 to simply let the LLR data from the channel detector 108 pass through via the second input (no modification). For the purposes of the discussion, this is still considered "replacement LLR data".

The windowed defect detector 116 may generate output LLR data 116$b$ depending on the outcome of the defect detection processing conducted by the defect detector. The output LLR data feeds into the third input of MUX 122. The windowed defect detector 116 can control the MUX 122 to select the third input. For example, for certain defects it may be desirable to modify the incoming LLR data (output from the channel detector 108) by multiplying it with a scale factor S (e.g., S=0.5, S=0.25, etc.) to produce the output LLR data 116$b$. Another modification of the incoming LLR data is to limit the value to some maximum value M (i.e., the incoming LLR can be truncated). For example, if the incoming LLR is greater than M (M=5 or M=10, for example) then the windowed defect detector 116 can output M as the output LLR data 116$b$. Still another modification of the incoming LLR data is to replace it with one or more predefined values. A typical predefined value is "0", which is already taken care of at input 1 of the MUX 122. In other embodiments, other non-zero predefined values can be used.

At 208, the replacement LLR data 122$a$ that is output by the MUX 122 can be fed into the decoder 158 for subsequent downstream processing.

FIG. 2A illustrates a single channel iteration configuration, where defect detection is performed based on the LLR data and the LLR data is replaced accordingly. In other embodiments, additional channel iterations can be performed as shown in FIG. 2B. Blocks 202-208 represent a first channel iteration. The defects detected at 204 can be used to modify subsequent LLR data produced in subsequent channel iterations. Thus, in a loop 210-218, one or more additional channel iterations can be performed. The output of decoder 158 as in FIG. 1A can be fed back into the channel detector 108, thus generating new LLR data (block 212). Using the defects detected at 204, new LLR data output by the channel detector 108 can be fed into the windowed defect detector 116 and the MUX 122 to produce replacement LLR data 122a at 214. The replacement data can be generated in various ways, e.g., via input 1, input 2, or input 3 of MUX 122 in the manner discussed above in connection with block 206. The resulted replacement LLR data 122a is fed into the decoder 158 (block 216 in FIG. 2B), and the output of the decoder is then fed back to the channel detector 108 for yet another iteration (block 218 in FIG. 2B).

In some embodiments, defect detection may proceed as illustrated with reference to the LLR data shown in FIG. 3. The figure shows an example of a plot of LLR data that can be received at the output of the channel detector 108 (shown in FIG. 1A). The data shown in FIG. 3 may represent a codeword or a sector of data, or any other suitable unit of data that can be read out from the storage medium 152 (shown in FIG. 1A). The term "block of data" refers to a codeword or sector of data. The vertical axis represents values of the LLR data, and the horizontal axis is the bit index or symbol index. The bit index refers to the order of the bit or symbol in the data stream as the recorded data is read in from the storage medium 152. The very first bit read is numbered "1", the second bit is numbered "2", and so on. The plot shown in FIG. 3, for example, shows LLR data from the $1100^{th}$ bit to the $1800^{th}$ bit.

Figure 3:
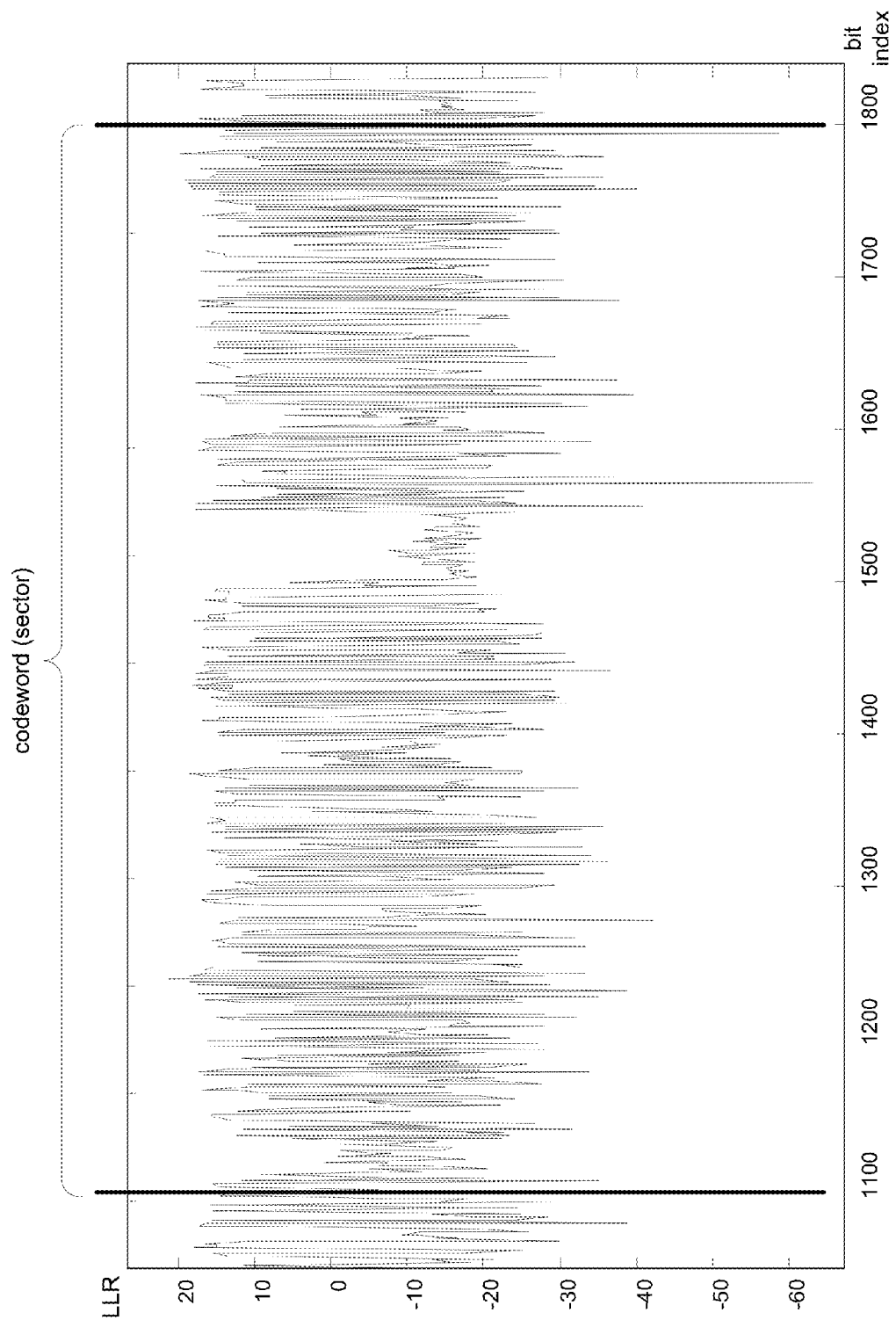
FIG. 3 is an illustrative example of LLR data for a sample of bit positions.
Figure 3A:
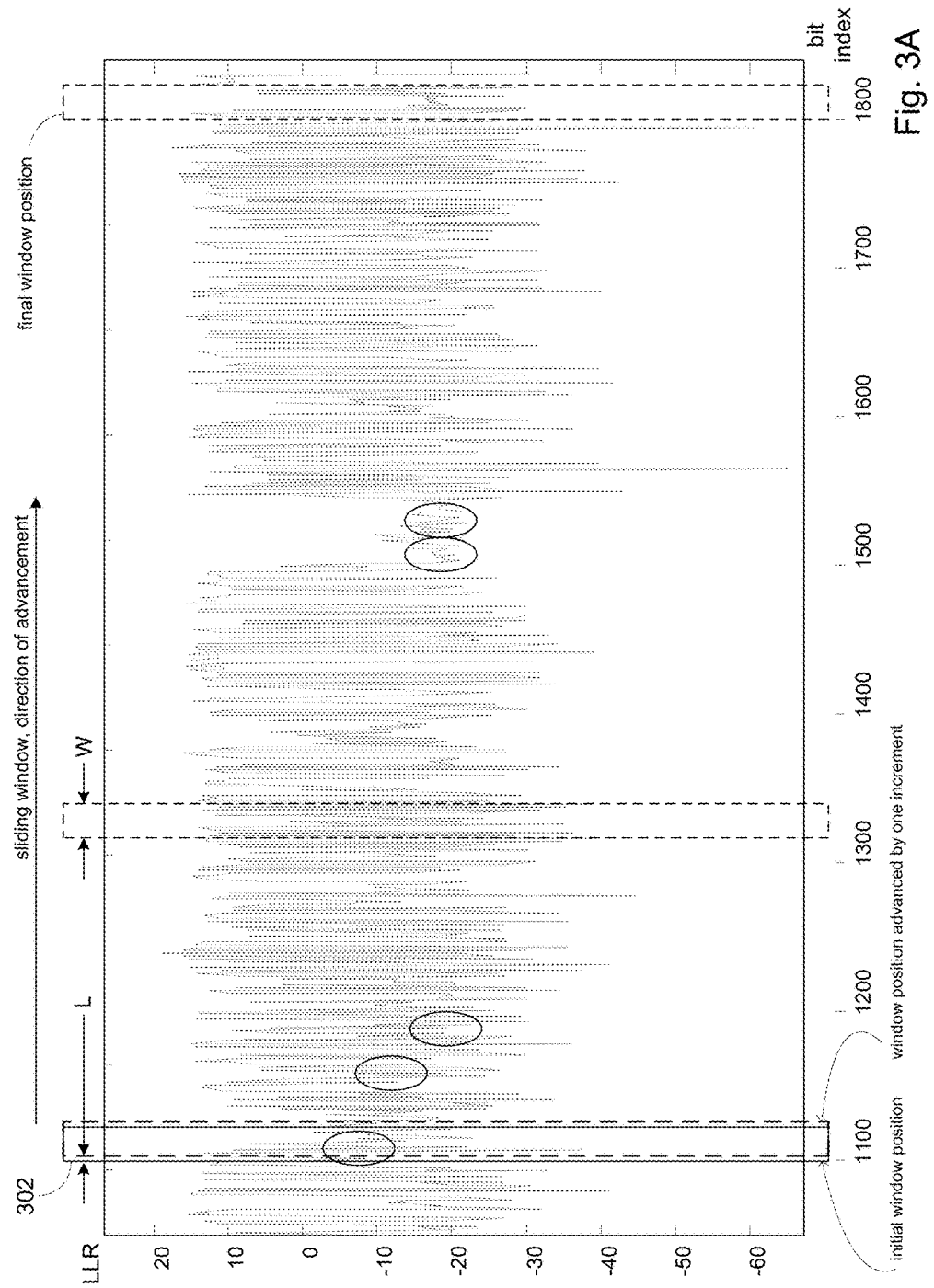
FIG. 3A illustrates a sliding window for the LLR data shown in FIG. 3.

Processing of the LLR data shown in FIG. 3 in accordance with disclosed embodiments is illustrated in FIG. 3A. In some embodiments, the LLR data corresponding to a block of data may be analyzed utilizing a sliding window algorithm. The LLR data shown in FIG. 3A is grayed out in order to highlight aspects of the sliding window process. A window 302 designates a subset of the LLR data for analysis and is incrementally advanced (slid) with each round of the analysis. The window 302 starts at the beginning of the block of data, and incrementally advances across the block of data until reaching the end of the block of data to its final position.

Figure 4A:
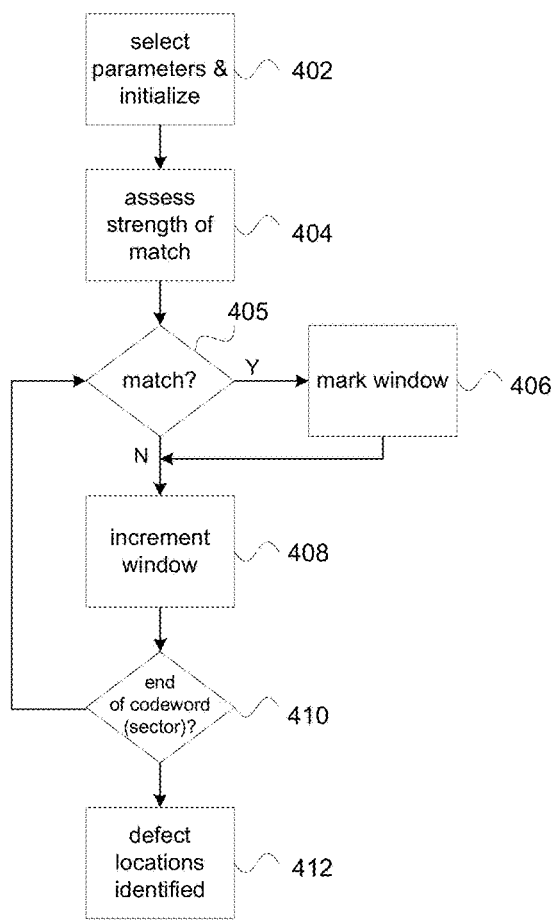
FIGS. 4A-4C represent process flows for detecting defects in accordance with principles of the present disclosure.
Figure 4B:
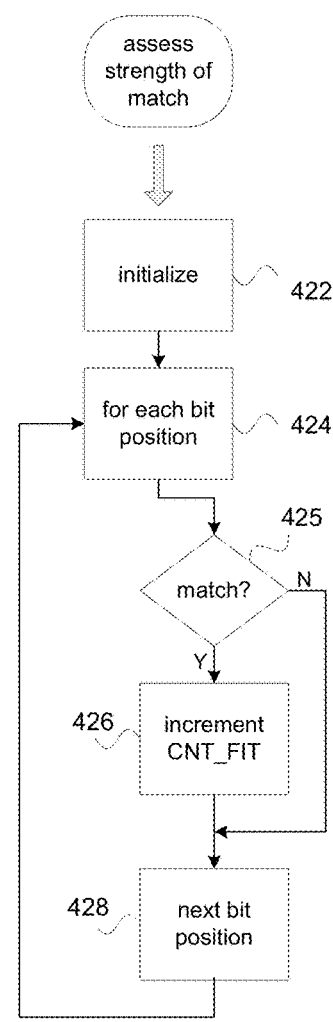

Referring to FIGS. 4A and 4B, defect detection (block 204 in FIG. 2) for a given block of data (e.g., FIG. 3A) in accordance with embodiments of the present disclosure may proceed as follows. Parameters for defect detection may include:

W—This parameter represents a size (number of bits) of the window 302;

L—This parameter represents a window step size;

THR—This parameter represents one or more LLR pattern vectors; and $N_w$—This parameter is a threshold for the number of LLRs within a window W that fit the threshold pattern. As will be explained below, $N_w$ can be used to decide whether a window of data contains a defect.

The window size W specifies the number of data points contained in the window of data spanned by the window 302. For example, the window 302 may be W=16 bits. The window step size L specifies how many data points to slide the window with each round. For example, L may be equal to 1 so that the window slides over one bit at a time.

In accordance with the present disclosure, an LLR pattern vector defines a defect. In some embodiments, an LLR pattern vector comprises a set of one or more data patterns. Each "data pattern" can be defined by a relational expression including a relational operator (e.g., less than, greater than, equal to, and so on) and a value, although other forms or representation can be employed. FIG. 5 represents an example of an LLR pattern vector in accordance with embodiments of the disclosure. An LLR pattern vector contains as many data patterns as the window size W. The example in FIG. 5 represents an LLR pattern vector for W=5 and thus contains five data patterns: "$<T_1$", "$>T_2$", "$>T_3$", "$>T_4$", and "$<T_5$".

Continuing with FIG. 4A, at 402, the foregoing parameters are selected and a relative window position, k, is initialized to a start location of zero; i.e., a window 302 of width W is aligned to the beginning of the block of data. Consider the block of data shown in FIG. 3A. Assume the block of data of interest spans bit positions 1100 to 1800. Assume further a window size of W=15 and a step size of L=1. These parameters are illustrated in the figure, although the scale is slightly exaggerated for illustrative purposes. On the first round, the initial window position will be k=0 and will span the data between bit positions 1100 to 1114. On the next round, the window 302 will advance to a position k=1 (step size L=1) and will span the data between bit positions 1101 to 1115, the next window position after that will be k=2 and will span the LLR data between bit positions 1102 to 1116, and so on. The current position of window 302 (referred to herein as "the current window") will continue to advance until k=700, the size of the block of data.

At 404, for a given window position, the LLR data in the current window is compared to an LLR pattern vector. In some embodiments, a counter may be used to count the number of "matches" between the LLR data in the current window position and an LLR pattern vector. The counter may be used as a measure of how well the LLR data in the current window position matches the LLR pattern vector. In other words, the counter may represent a measure of the strength of the match between the LLR data in the current window against an LLR pattern vector. In some embodiments, block 404 may use more than one LLR pattern vector to compare against the LLR data, as will be discussed below.

In a step 405, if the counter used in 404 is greater than or equal to $N_w$, then at 406 the bit positions of the current window position can be marked or otherwise noted as having a defect and processing continues at 408. Otherwise processing simply proceeds to 408. At 408, the window 302 is advanced by the step size L, and if the end of the block of data has not been reached (block 410), then another round of processing is performed beginning at block 404 with the next window position.

At 412, the defect locations on a per window basis is identified for the given block of data, and in embodiments the defect locations can be stored or otherwise retained for subsequent channel iterations as explained above. In some embodiments, the defect locations are identified by their beginning and ending bit positions. Merely as an illustrative example and using the example in FIG. 3A where the window size W=15, defects in the block of data and circled in FIG. 3A can be identified by the following bit positions (indices): 1118-1132, 1167-1181, 1193-1207, 1503-1517, and 1518-1532.

FIG. 4B shows additional detail for match determination block 404 of FIG. 4A. In an embodiment, a counter CNT_FIT counts the number of "matches" between the LLR data in the current window position and the LLR pattern vector. Accordingly, at 422, the CNT_FIT counter can be set to zero, along with initializing other parameters that may be required.

Each bit position in the current window is processed in a loop 424-428. Thus, at 425, the LLR for a given bit position is individually matched with its corresponding data pattern in the LLR pattern vector. Each occurrence of an individual match increments the CNT_FIT counter by one (block 426). At 428, the LLR data in the next bit position in the current window is compared. For instance, suppose the current window comprises the following LLR data $\{d_1, d_2, d_3, d_4, d_5\}$ for five bit positions. The data are compared to the elements in the LLR pattern vector shown in FIG. 5. The loop 424-428 would be repeated five times, once for each bit position. The first round tests the LLR data in the first bit position $d_1$ against the first data pattern of the vector "$<T_1$". If the relation designated in the first data pattern is satisfied, namely $d_1<T_1$, then CNT_FIT is incremented by 1. A second round tests the second bit position. Another match occurs if the LLR data in the second bit position $d_2$ satisfies the relation designated in the second data pattern, namely $d_2>T_2$, and so on.

When the match determination process of FIG. 4B has completed, processing continues in block 405 of FIG. 4A. The determination performed in 405 may include comparing the counter CNT_FIT with $N_w$. For example, if CNT_FIT≥$N_w$, then block 405 evaluates to YES and processing proceeds to block 406; otherwise the block 405 evaluates to NO and processing proceeds to block 408.

The match determination process in FIG. 4B assumes a single LLR pattern vector. It can be appreciated, however, that matching the LLR data in the current window to an LLR pattern vector can be generalized to matching against more than one LLR pattern vector. In an embodiment, processing multiple LLR pattern vectors can be conducted in the manner shown in FIG. 4C. Each LLR pattern vector would be associated with its own CNT_FIT counter. For example, an array of LLR pattern vectors can be provided and a corresponding array of CNT_FIT counters can be provided, where the $i^{th}$ LLR pattern vector would be associated with the $i^{th}$ CNT_FIT counter.

At 432, various parameters can be initialized. For example, an array of CNT_FIT counters may be initialized. Likewise, an array of LLR pattern vectors may be initialized by reading in predefined LLR pattern vectors. A loop 432-442 is iterated for each bit position in the current window. For each bit position, an inner loop 436-440 is iterated for each LLR pattern vector in the array of LLP pattern vectors. Thus, for a given LLR pattern vector in the array of LLR pattern vectors (the $i^{th}$ LLR pattern vector) and for a given bit position in the current window, a comparison is made with the corresponding data pattern in the $i^{th}$ LLR pattern vector, step 437. If a match occurs, then the CNT_FIT counter in the array of CNT_FIT counters that is associated with the $i^{th}$ LLR pattern vector is incremented at 438. In block 440, the next LLR pattern vector from the array of array of LLR pattern vectors is selected and the loop 436-440 is repeated.

Figure 4C:
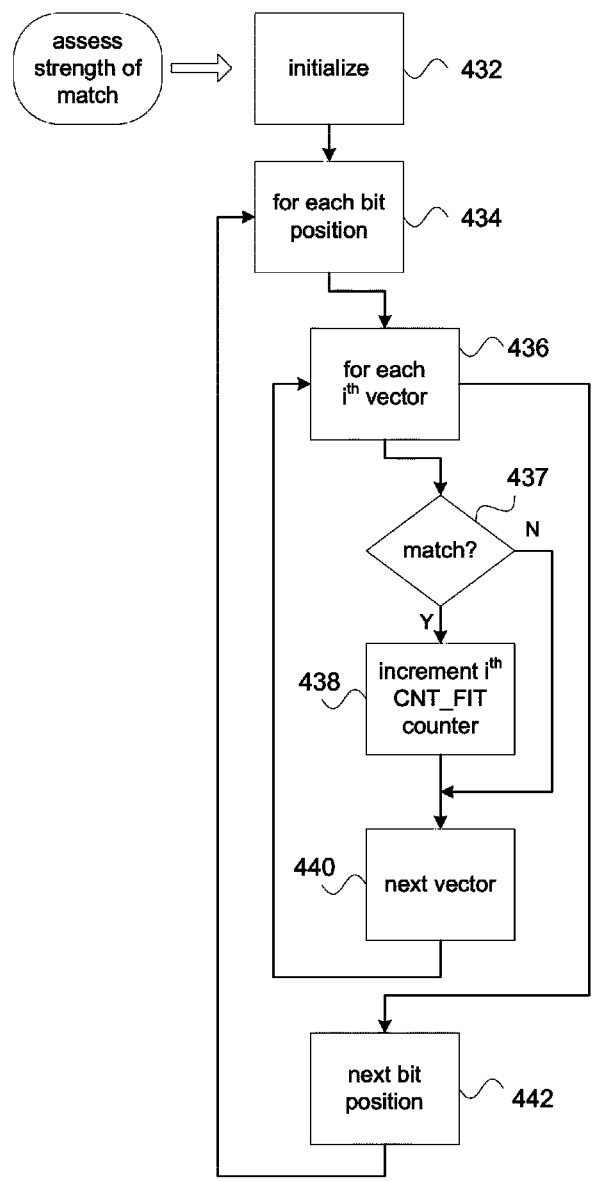

When the match determination process of FIG. 4C has completed, processing continues in block 405 of FIG. 4A. In other embodiments, block 405 in FIG. 4A can accommodate multiple LLR pattern vectors. In particular, each counter in the array of CNT_FIT counters can be tested against the threshold value $N_w$. If any of the CNT_FIT counters is greater than or equal to $N_w$, the current window can be marked as containing a defect (step 406).

A sampling of LLR pattern vectors is provided in FIG. 5A, illustrating a variety of patterns that can be defined. For example, the LLR data output from the channel detector 108 can be examined to identify occurrences of short burst errors. Based on an examination of such data, one or more pattern vectors can be defined to identify such errors.

Figure 5D:
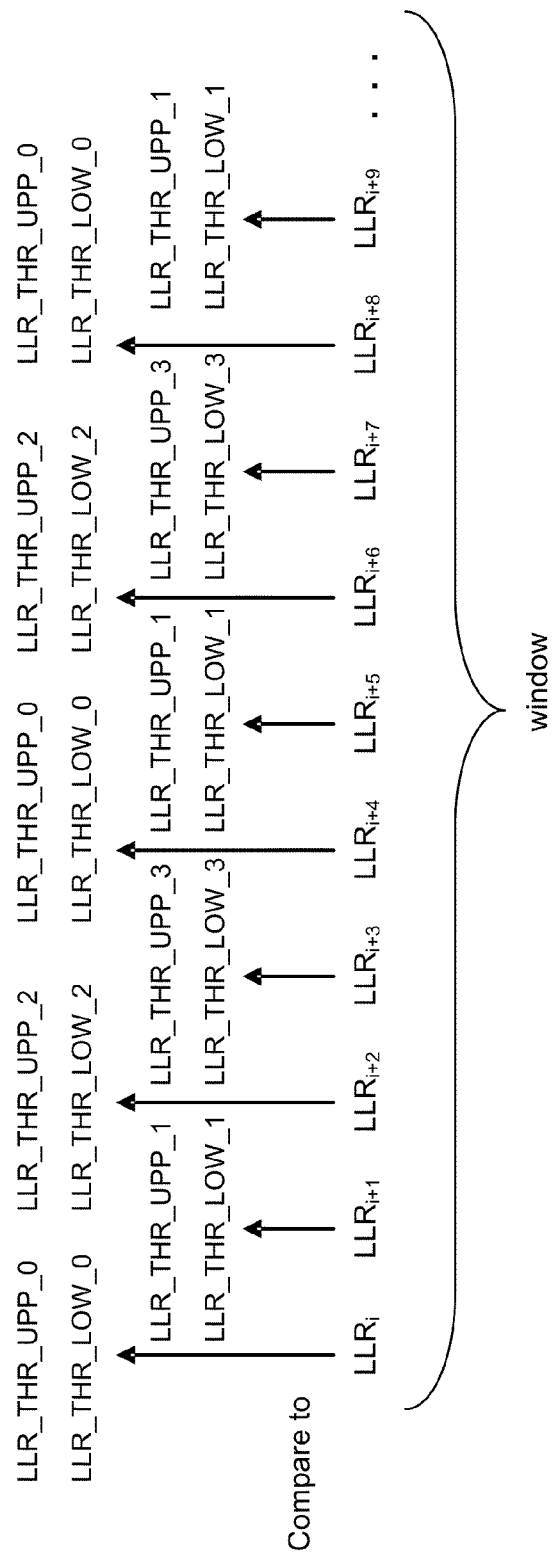
Figure 6A:
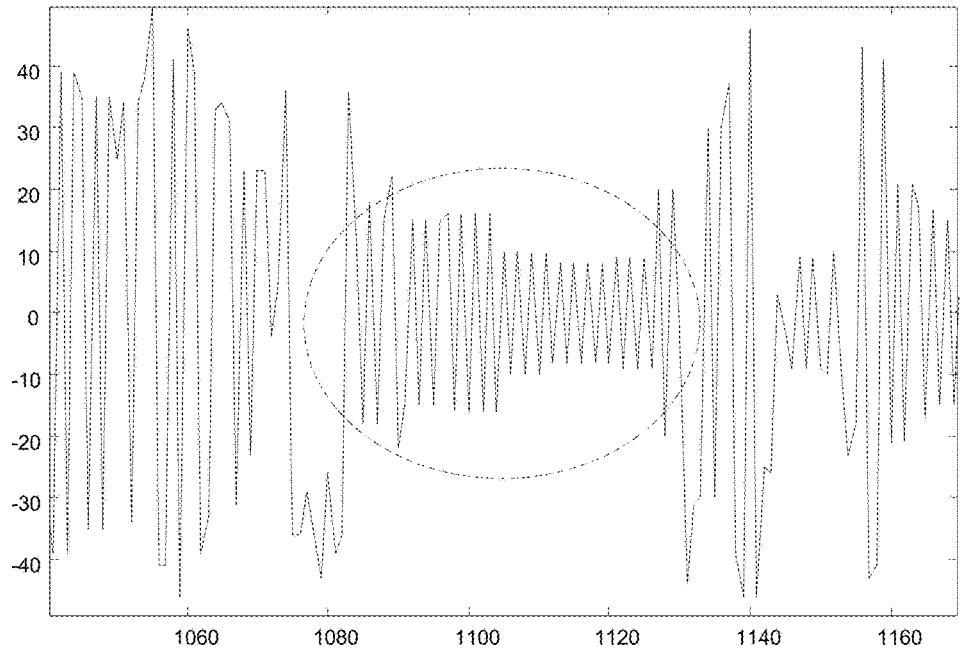
FIGS. 6A and 6B illustrate examples of defects as reflected in the LLR data.

As an example, consider the LLR data collected in FIG. 6A. A class of media defects may result in amplitude drop-outs in the signal; i.e., the signal amplitudes are close to zero. For many equalization targets in an HDD system, the FIR sequence is fairly close to actual path; i.e., a path corresponding to the "Nyquist path" 010101 . . . . Accordingly, the LLR data sequence out of the channel detector 108 in such defect regions appears as having a Nyquist path. The error burst identified is sometimes referred to as a "zigzag Nyquist pattern", comprising a pattern of 010101 . . . or 101010 . . . , where the LLR values alternate about "0" at above +X and below −X, where X is some LLR magnitude. The pattern vectors 1 and 2 in FIG. 5A look for LLR values that alternate between less than −X and greater than +X (pattern vector 1) and LLR values that alternate between greater than +X and less than −X (pattern vector 2).

Figure 6B:
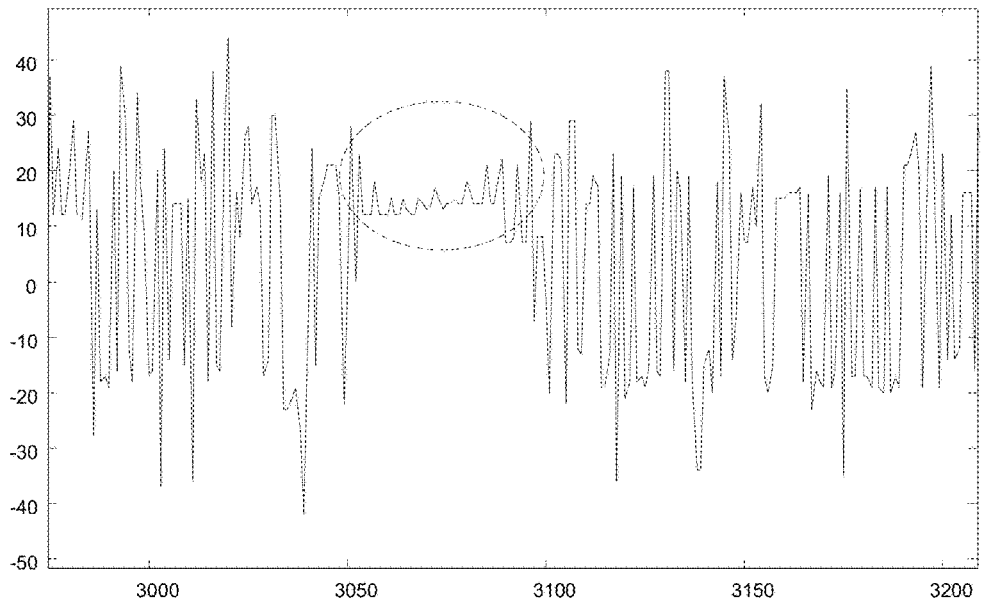

Consider another example of LLR data collected from the output of the channel detector 108. FIG. 6B shows a data burst error (circled region) in which a run of about 30 bit positions receive an LLR value of +T or more, where T is some LLR magnitude. Accordingly, the pattern vector 3 in FIG. 5A might be used to detect such errors. The pattern vector basically comprises 10 data patterns designating ">T", where T, for example, is +8. Then, assuming $N_w$=10, an occurrence of 10 consecutive occurrences of LLR data>+8 in a window will be deemed a defect. We note that this example is typical when precoder 1/(1+D) is utilized in the HDD system. We also note that in an embodiment, defect detection in accordance with the present disclosure may utilize this precoder 1/(1+D) even if such precoder was not used during encoding. The reason is that such precoder maps the Nyquist pattern 1010 . . . into a pattern that may be more suitable for ubiquitous detection; for example, detecting pattern 1111 . . . with precoder 1/(1+D) turned ON in detection corresponds to detecting both 0101 . . . and 1010 . . . in instances when precoder is turned OFF. Note that the pattern 1111 . . . is matched via pattern vector 3 in FIG. 5A.

In another embodiment, some other precoder may be used to map the patterns of interest in detection (e.g. Nyquist or some other pattern) into the desired pattern. Then, the desired pattern is matched via appropriate pattern vectors.

FIG. 5A illustrates LLR pattern vectors comprising relational operators such as greater than, less than, and so on. In other embodiments, a data pattern can be any mathematical expression. For example, the pattern vector in FIG. 5B includes a data pattern comprising a relational expression that specifies a range of values. A match of this data pattern may require that the LLR data d in the second bit position of the current window satisfy the following relational expression:

$$T_1 \leq d \leq T_2.$$

Occurrences of a sequence of LLR data within a window can be tested for. FIG. 5C, for example, illustrates a pattern vector that repeats within a window. It was noted above that in other embodiments, the number of data patterns in a pattern vector equals the window size W. However, in other embodiments, such as the example shown in FIG. 5C, an LLR pattern vector may have fewer data patterns than the window size. FIG. 5C shows a pattern vector having four data patterns, but the window size W is greater than 4. In such embodiments, the pattern vector is repeatedly applied to every N bit positions within the current window where N is the size of the pattern vector. For example, the LLR data $d_1$-$d_4$ in bit positions 1-4 of the current window would be tested as follows:

$$T_1 \leq d_1 \leq T_2$$

$$T_4 \leq d_2 \leq T_3$$

$$d_3 > T_5$$

$$T_7 \leq d_4 \leq T_6$$

The LLR data $d_5$-$d_8$ in the next four bit positions in the current window can be tested as follows:

$$T_1 \le d_5 \le T_2$$

$$T_4 \le d_6 \le T_3$$

$$d_7 > T_5$$

$$T_7 \le d_8 \le T_6$$

and so on. The counter CNT_FIT is incremented each time there is a match.

In a particular embodiment, the pattern vector of FIG. 5C can be implemented using data registers (e.g., registers of a CPU in the defect detector 116). For example, the data patterns in FIG. 5C can be stored in eight registers R0-R7:

$R0$=LLR_THR_UPP_0

$R1$=LLR_THR_LOW_0

$R2$=LLR_THR_UPP_1

$R3$=LLR_THR_LOW_1

$R4$=LLR_THR_UPP_2

$R5$=LLR_THR_LOW_2

$R6$=LLR_THR_UPP_3

$R7$=LLR_THR_LOW_3

Logic can be provided that runs through the register pairs R0/R1, R2/R3, R4/R5, and R6/R7 for each set of four LLR data points in the current window. FIG. 5D illustrates the mapping for making the comparisons described above.

Figure 7:
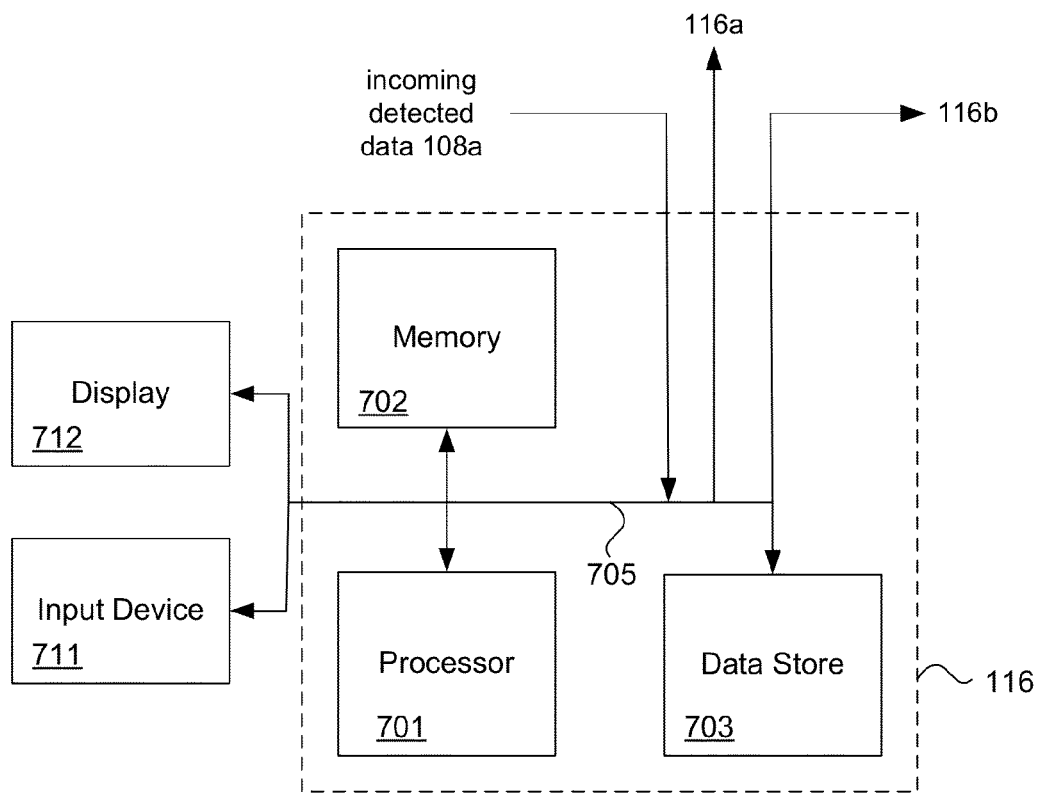
FIG. 7 shows a hardware embodiment of the present disclosure.

Referring to FIG. 7, in one embodiment, the windowed defect detector 116 comprises a processor 701 to perform the foregoing data analyses. The processor 701 may be a general purpose CPU, or a suitably programmed digital signal processor (DSP), or a suitable programmed gate array. The windowed defect detector 116 may include some form of volatile memory 702 such as DRAM, for example, to store temporary data during processing.

A non-volatile memory (e.g., flash memory, ROM, and so on) may constitute a data store 703 for storing programs that can be executed on the processor 701. The data store 703 may include predefined values for window size W, step size L, one or more pattern vectors, and so on.

A system of buses 705 can interconnect the foregoing subsystems, providing control lines, data lines, and/or voltage supply lines to/from the various subsystems. The buses 705 may include data and control lines connected to the channel detector 108 in order to receive incoming detected LLR data 108a. The buses 705 may includes data and control lines to output LLR data 116b that feed into the MUX 122. As explained above, the output LLR data 116b can be generated by scaling the incoming LLR data with a scale factor S, or truncating the incoming LLR data, and so on. In other embodiments, the processor 701 may perform one or more such operations on the incoming LLR data to produce the output LLR data 116b. The buses 705 may also include a select signal that is output with the control flags and/or data 116a and which feeds into MUX 122.

The windowed defect detector 116 may include I/O ports for connecting display or input devices 712 and 711 in order to allow a user to access the system, for example, during development, for troubleshooting, managing predefined values (such as pattern vectors), and so on.

The windowed defect detector 116 may operate in a mode referred to as "on the fly." In this mode of operation, the windowed defect decoder 116 processes incoming blocks of detected data (e.g., LLR data 108a as shown in FIG. 1) using a fixed set of parameters. For example, the same pattern vector used for pattern matching. The pattern matching is performed using the same window size parameter, W. The same threshold value, $N_W$, is used as the criterion for detecting defects, and so on. Using a fixed set of parameters to process each block of detected data allows the windowed defect detector 116 to process data in a constant predictable amount of time. "On the fly" mode of operation therefore may be used during normal operation to detect and correct many defects, while at the same time sustaining data throughput for a given data rate of the read channel 100.

However, in some embodiments, the windowed defect detector 116 may include a "retry" mode of operation, in which additional processing power may be brought to bear on a detected defect. In "retry" mode, the windowed defect detector 116 may be configured to employ additional pattern vectors, use different window sizes, use different threshold value $N_W$, and so on in order to detect and correct a defect. Understandably, "retry" mode is a potentially processor- and time-intensive effort. In some embodiments, a "retry" mode of operation may be invoked by the decoder 158 when the decoder determines that a failure has occurred.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present disclosure along with examples of how aspects of the present disclosure may be implemented. The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents will be evident to those skilled in the art and may be employed without departing from the spirit and scope of the disclosure as defined by the claims.

What is claimed is:

1. A method for detecting defects on a non-transitory storage medium comprising:
    receiving incoming detected data generated by reading information recorded on a non-transitory storage medium;
    identifying the defects in the non-transitory storage medium based on comparison between the incoming detected data and a predetermined data pattern wherein the incoming detected data is generated independently of the predetermined data pattern; and
    storing location information indicative of locations of the defects on the non-transitory storage medium.

2. The method of claim 1 further comprising:
    generating replacement data based on the identification of the defects, and
    providing the replacement data to a decoder.

3. The method of claim 2 wherein
    the incoming detected data is produced by a channel detector;
    an output of the decoder is provided to the channel detector to produce subsequent data; and at least a subset of the subsequent data are modified based on the location information indicative of locations of the defects on the non-transitory storage medium.

4. The method of claim 2 wherein the replacement data have a predetermined value.

5. The method of claim 2 wherein generating the replacement data includes multiplying the incoming detected data by a scale factor or truncating the incoming detected data.

6. The method of claim 1 wherein said identifying the defects in the non-transitory storage medium includes
defining a sliding window that identifies a plurality of subsets of the incoming detected data; and
comparing the incoming detected data of each subset with the predetermined data pattern.

7. The method of claim 1 wherein the data pattern is implemented using data registers.

8. The method of claim 1 wherein the data pattern comprises a relational expression.

9. The method of claim 1 further comprising receiving an analog signal from a read/write head, wherein the incoming detected data is produced from the analog signal.

10. The method of claim 1 wherein the non-transitory storage medium is a non-transitory magnetic storage medium.

11. A disk drive system including defect detection circuitry configured to perform steps of claim 1.

12. A circuit comprising:
a processor configured to:
receive incoming detected data from input data generated by reading information recorded on a storage medium;
identify defects in the storage medium based on comparison between the incoming detected data and a predetermined data pattern, wherein the incoming detected data is generated independently of the predetermined data pattern; and
store location information indicative of locations of the defects on the storage medium.

13. The circuit of claim 12 wherein the processor is further configured to:
generate replacement data based on the identification of the defects, and
provide the replacement data to a decoder.

14. The circuit of claim 13 wherein
the incoming detected data is produced by a channel detector;
an output of the decoder is provided to the channel detector to produce subsequent data; and
at least a subset of the subsequent data is modified based on the location information.

15. The circuit of claim 14, wherein the replacement data have a predetermined value.

16. The circuit of claim 14 wherein the replacement data are generated by multiplying the incoming detected data by a scale factor or by truncating the incoming detected data.

17. The circuit of claim 12 wherein comparing the incoming detected data to the data pattern includes:
defining a sliding window that identifies a plurality of subsets of the incoming detected data; and
comparing the incoming detected data of each subset with the predetermined data pattern.

18. The circuit of claim 12 further being incorporated in a read channel of a magnetic disk storage system.

19. The circuit of claim 12 further being incorporated in a hard disk drive system.

20. The circuit of claim 12 wherein the detected data is Log Likelihood Ratio (LLR) data.

* * * * *